(12) United States Patent
Laloi

(10) Patent No.: US 12,164,840 B2
(45) Date of Patent: *Dec. 10, 2024

(54) METHOD FOR CONSOLIDATING A KEY INDICATOR OF A VIRTUAL OBJECT IN AN INDEX

(71) Applicant: DASSAULT SYSTEMES, Velizy Villacoublay (FR)

(72) Inventor: Alexandre Laloi, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/096,642

(22) Filed: Nov. 12, 2020

(65) Prior Publication Data

US 2021/0150100 A1 May 20, 2021

(30) Foreign Application Priority Data

Nov. 19, 2019 (EP) .................................... 19306481

(51) Int. Cl.
*G06Q 10/06* (2023.01)
*G06F 16/953* (2019.01)
*G06F 30/15* (2020.01)
*G06Q 10/0631* (2023.01)
*G06Q 10/0639* (2023.01)

(52) U.S. Cl.
CPC ............ *G06F 30/15* (2020.01); *G06F 16/953* (2019.01); *G06Q 10/0631* (2013.01); *G06Q 10/06393* (2013.01)

(58) Field of Classification Search
None
See application file for complete search history.

(56) References Cited

U.S. PATENT DOCUMENTS

| 7,636,643 B1* | 12/2009 | Circenis ................. G01D 13/02 |
| | | 702/130 |
| 9,521,052 B1* | 12/2016 | Nandyalam ......... G06F 11/3003 |
| 9,521,062 B2 | 12/2016 | Rajesh et al. |
| 2005/0165733 A1* | 7/2005 | Strovink ............... G06F 16/283 |

(Continued)

OTHER PUBLICATIONS

Koetter et al. (A model-driven approach for event-based business process monitoring, Published online: Jan. 18, 2014, Inf Syst E-Bus Manage (2015) 13:5-36. pp. 5-36).*

(Continued)

*Primary Examiner* — Matthew D Henry
(74) *Attorney, Agent, or Firm* — Oblon, McClelland, Maier & Neustadt, L.L.P.

(57) ABSTRACT

A computer implemented method for consolidating at least one key indicator of a virtual object receiving a description of at least one key indicator of the virtual object, receiving a set of attributes (ATT) of the virtual object, receiving a data model (DM) for indexation of said virtual object, receiving a set of rules (RUL) to convert the attributes of the virtual object (OBJ) into the data model (DM) for indexation, applying the set of rules (RUL) to convert said attributes into the data model (DM) for indexation, transforming the data model (DM) for indexation into a directed acyclic graph, and consolidating said key indicator based on an expansion of the directed acyclic graph.

13 Claims, 8 Drawing Sheets

(56) References Cited

U.S. PATENT DOCUMENTS

| | | | | |
|---|---|---|---|---|
| 2007/0106409 | A1* | 5/2007 | Anelle | G06F 30/15 |
| | | | | 700/103 |
| 2009/0254551 | A1* | 10/2009 | Stluka | G06F 16/00 |
| 2010/0249978 | A1* | 9/2010 | Solimano | G06Q 10/04 |
| | | | | 700/111 |
| 2013/0014916 | A1* | 1/2013 | Wadley | F28D 15/046 |
| | | | | 29/890.032 |
| 2014/0013318 | A1* | 1/2014 | Rychikhin | G06F 8/65 |
| | | | | 717/172 |
| 2021/0150441 | A1* | 5/2021 | Laloi | G06Q 10/06393 |

OTHER PUBLICATIONS

Extended Search Report issued Jun. 2, 2020 in Europe Patent Application No. 19306481.3-1224; 11 pgs.

Cheng-Kuan Lin, et al.; "Feature-based Estimation of Preliminary Costs in Shipbuilding"; Ocean Engineering; vol. 144; Nov. 1, 2017; XP085242197; ISSN: 0029-8018: 3 pgs.

Runar Aasen, et al.; "Utilizing CAD/CAM Models for Ongoing Weight Estimation and Control"; $12^{th}$ International Conference on Computer and It Application in the Maritime Industries Compit 13; Apr. 17, 2013; XP055696490; 11 pgs.

* cited by examiner

Entity

KI1 — Weight (value, tolerance, confidence)

KI2 — Carbon footprint (value, tolerance, confidence)

KI3 — Nominal power (value, tolerance, confidence)

KI4 — Center of Gravity (value, tolerance, confidence)

FIG.3

METHOD FOR CONSOLIDATING A KEY INDICATOR OF A VIRTUAL OBJECT IN AN INDEX

CROSS-REFERENCE TO RELATED APPLICATIONS

This application claims priority under 35 U.S.C. § 119 or 365 to European Application No. 19306481.3, filed Nov. 19, 2019. The entire contents of the above application(s) are incorporated herein by reference.

FIELD

The disclosure pertains to the field of Computer Aided Engineering (CAE) and, more precisely, of Computer Aided Design (CAD). It relates to a computer-implemented method of consolidating a key indicator of a virtual object constituted by a plurality of object parts, in particular complex objects.

BACKGROUND

A Key Indicator (KI) is a measure characteristic that enables to take strategical decisions. There are several types of Key Indicators, among them:
Key Sustainable Indicators (KSIs), for example the carbon footprint, the impact on rare resources;
Key Quality Indicators (KQIs), for example defect rate during the production of object parts;
Key Performance Indicators (KPIs), for example the weight (hereinafter also referred to as the mass) of the object, its inertia matrix, its gravity center (these parameters are commonly called "weight and balance"), and, depending on the object: the range, the breaking distance, the air penetration coefficient, the minimal length of the track for takeoff or landing, etc.

Within a couple of decades, the number of parts constituting complex objects has been enormously expanded in digital models, from a few thousands of parts to millions of parts, thereby tremendously complicating the consolidation of Key Indicators.

SUMMARY

An object may be described by using of a global structure comprising the engineering bill of materials (which reflects how the object is designed), the manufacturing bill of materials (which is focused on the parts that are needed to manufacture the object), the bill of process of the object during its use, and the bill of materials of the end of life of the object. The manufacturing bill of materials describes the object in terms of its sub-assemblies. It consists, for example, of an itemized list of parts of a structure shown on a drawing in the shape of a table. Therefore, a bill of materials can be represented by a hierarchical tree structure, with a root entity and sub trees of children (leaves) with a parent node. Consolidating a Key Indicator of an object is an investigation of this global bill of materials, from leaves to the root of the tree. The bottom-up computation of the metrics is made by a rollup operation (or simply referred to as "rollup"). The rollup function is defined as the way the value of the metrics is bottom-up computed. At each level of the tree, a complex process of decision-making and consolidation applies.

Some Key Indicators are relatively easy to consolidate: for example, the consolidation of the mass of a virtual object consists in adding the mass of all the parts of the object. Thus, the rollup mainly consists in adding values, which is not so CPU-consuming. However, the difficulty is that a wide variety of subcontractors may be implied during the manufacturing and engineering processes. This implies that the data (text documents, spreadsheets, in ERP software, or in CAD software) which are necessary to consolidate the Key Indicators, even the one which are not CPU-consuming, are stored in several systems and may not be up-to-date. Each of those systems may be seen as a "silo", to the extent that each system is closed off from other systems. Operating in silos impacts the efficient consolidation of Key Indicators.

Other Key Indicators relate to the inertia matrix of the object. In order to consolidate an inertia matrix, it is first required to compute the moments of inertia and the products of inertia of the leaves. The inertia matrix is then a 3×3 matrix containing those values, relative to the three-axis system in which the object is instantiated. Then, the inertia matrix is diagonalized. The eigenvalues of the diagonalized are the principle moments of inertia of the object, and the three eigenvectors are the principle axes of inertia. It can be noticed that diagonalizing a matrix is CPU-consuming. Moreover, once the inertia matrix has been computed for a part of the object (corresponding to the lowest child of the bill of materials), the inertia matrix of the parent part of the object is computed, based on the moments of inertia of the child object and based on the axes of inertia of the child object. Therefore, very complex matrix calculations are implemented, when rolling up the inertia matrix from a child to a parent in the bill of materials. In that case, the rollup is carried out by implementing the parallel axis theorem, also known as Huygens-Steiner theorem. In that case, the rollup function is dictated by the Huygens-Steiner theorem.

For that reason, the consolidation of Key Indicators with millions of parts lasts hours, which is not acceptable. In particular, the exact measure of the weight and balance of a cruise ship, which is a very complex operation compared to other Key Indicators, is estimated with a high degree of incertitude in practice during the design of the ship. Nowadays, a manufacturer is unable to determine the exact mass of a ship during the design phase, or even during the manufacturing phase. The ship, once built, is launched in the water, and the mass is derived from the volume displaced water. If the buoyancy needs to be corrected, the ship is then weighted with extra equipment. It is reminded that the weight and balance of a cruise ship is critically important since it indicates the way the cruise ship passes through waves.

In the automotive area, a huge number of Key Performance Indicators are monitored during the design process of a vehicle. For example, for a racing car, up to 350 KPI may be monitored. In practice, during project reviews, a huge quantity of Key Performance Indicators are analyzed, and some Key Performance Indicators may be privileged over others. The consolidation of KPI is fully integrated decision-making procedure; thus, it must be carried out whenever a strategic decision has to be made.

Another constraint in the automotive area is relative to the high number of possible configurations of a vehicle. Up to now, car manufacturers consolidate Key Performance Indicators for only one vehicle, i.e. the one of the commercial line which is the heaviest, without considering the configurations diversity. Thus, the consolidation is carried out for a single graph. Moreover, the consolidation lasts hours, even for those limited number of vehicles, so the consolidated data are not up to date. Vehicles comprise an increasing number of parts, so it takes more and more time to consolidate KPIs, regardless of the different configurations.

A Key Performance Indicator such as the mass is also critical in astronautics, in particular for satellites. Agreements between the launcher operator/manufacturer and the satellite operator/manufacturer usually have specific provisions relating to the mass of the satellite, so that the satellite does not exceed a predefined mass. Indeed, during the launch phase, each kilogram of the payload has its importance in terms of propellant. In practice, the launcher operator/manufacturer may apply a penalty of several thousand Euros for a 1 kg error on the satellite. Therefore, the mass indicator must be rigorously monitored. It would also be interesting, for the satellite operator/manufacturer, to be able to quantify the tolerance computed during the rollup, for example through a margin of error.

Therefore, there is a need for providing a method for consolidating a key indicator of a virtual object, which is scalable, which manages different sources of data coming from different suppliers, and which considers the configuration diversity of the object.

One embodiment includes a computer implemented method for consolidating at least one key indicator of a virtual object, the method comprising, for a predefined configuration of the virtual object, the steps of:

a) receiving a description of at least one key indicator of the virtual object;
b) receiving a set of attributes of the virtual object;
c) receiving a data model for indexation of said virtual object;
d) receiving a set of rules to convert the attributes of the virtual object into the data model for indexation;
e) applying the set of rules to convert said attributes into the data model for indexation;
f) transforming the data model for indexation into a directed acyclic graph,
g) consolidating said key indicator based on an expansion of the directed acyclic graph.

In an embodiment, in the data model, the virtual object is characterized by:

at least one aggregate feature, said aggregate feature representing the composition of the virtual object according to a bill of materials; and/or at least one facet feature, said facet feature representing a categorization of the virtual object.

In an embodiment, the aggregate feature and the facet feature are referenced in an index.

In an embodiment, the aggregate feature and/or the facet feature are incrementally updated in the index.

In an embodiment, step g) comprises applying a rollup on the expanded directed acyclic graph in the index.

In an embodiment, step a) comprises receiving a rollup function of the key indicator during the rollup on the expanded directed acyclic graph, said rollup function representing the way the key indicator is bottom-up consolidated in the bill of materials of the virtual object.

In an embodiment, step g) comprises receiving a tolerance value of each aggregate feature, and computing a statistical tolerance based on a Euclidian distance of said tolerance values.

In an embodiment, the key indicator is a Key Performance Indicator of the virtual object.

In an embodiment, the Key Performance Indicator comprises the weight and balance of the object, in particular the weight of the virtual object and/or the center of gravity of the virtual object and/or the inertia matrix of the virtual object.

In an embodiment, step f) and step g) are implemented in a same software component.

In an embodiment, the virtual object is a vehicle, in particular a ship.

Another embodiment includes a computer program product, stored on a non-volatile computer-readable data-storage medium, comprising computer-executable instructions to cause a computer system to carry out the aforementioned method.

Another embodiment includes a non-transitory computer-readable data-storage medium containing computer-executable instructions to cause a computer system to carry out the aforementioned method.

Another embodiment includes a computer system configured for implementing the aforementioned method, comprising at least one client device, configured to process a user request of consolidating the at least one key indicator of a virtual object, and at least one index, said index being configured to implement at least the steps of transforming the data model for indexation into a directed acyclic graph and consolidating said key indicator based on an expansion of the directed acyclic graph.

In an embodiment, the system comprises a plurality of indexes, and an index controller, said index controller being configured for determining, among said indexes, the one which is able to process the user request the most rapidly, the steps of transforming the data model for indexation into a directed acyclic graph and consolidating said key indicator based on an expansion of the configured directed acyclic graph being implemented in said index.

BRIEF DESCRIPTION OF THE DRAWINGS

Additional features and advantages of the disclosure will become apparent from the subsequent description, taken in conjunction with the accompanying drawings, which show:

FIG. 3, examples of key indicators information attached to an entity in the data model;

DETAILED DESCRIPTION

Figure 1:
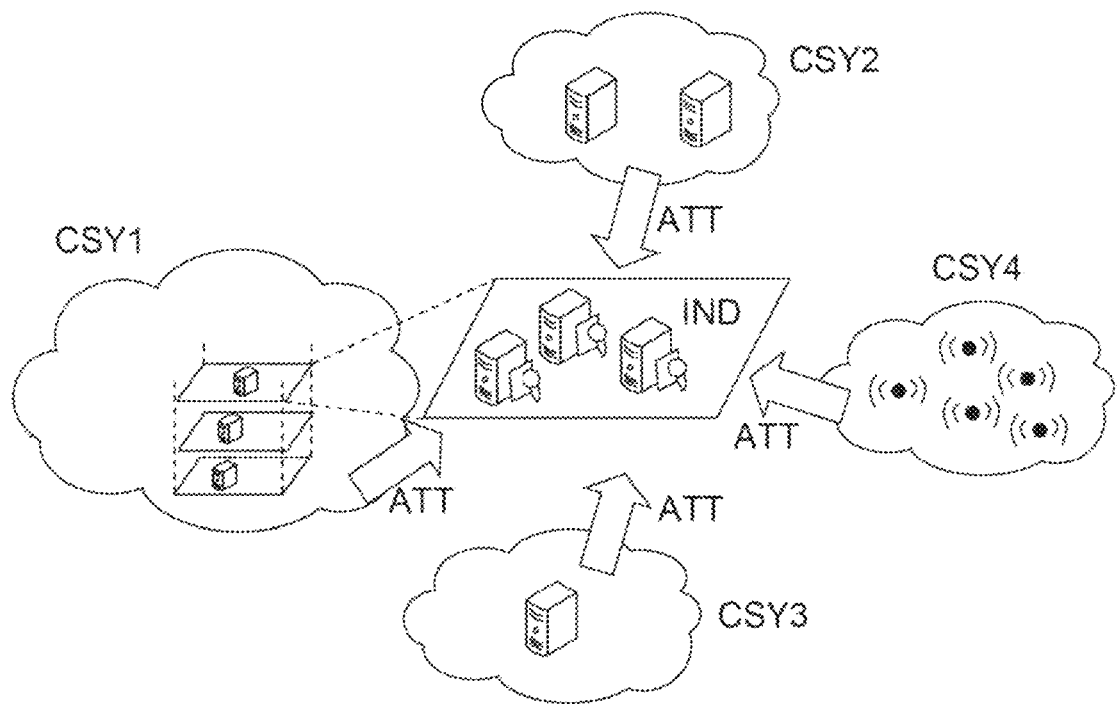
FIG. 1, the build phase of the index in the method according to an embodiment.

Described are two main steps, which will be called the "build" and the "run". FIG. 1 illustrates the build main step, in which four computing systems CSY are represented. Of course, the number of computing systems CSY is not a limitation. Each of the computing systems CSY may be:
- A PLM (Product Lifecycle Management) system CSY1 including a CAD (Computer Aided Design) system, which may provide 3D modeling data of the virtual object, and its diversification dictionary;
- An ERP (Enterprise Resource Planning) system CSY2, which may provide supply chain data;
- An EIS (Enterprise Information System) CSY3;
- A plurality of sensors CSY4, which may be connected to a network such as the Internet, for collecting data and transmitting them to another entity, directly or not.

The computing systems (CSY1, CSY2, CSY3, CSY4) are connected to the index IND of a search engine. The index IND is stored in a machine, or in a set of machines, which is/are connected to the computing systems CSY through connection means (cable, optical fiber, or wireless by using one of the wireless communication protocols). By "index", the person skilled in the art can also refer to a "cache", or a "data lake", that is to say a software component which can be queried, and which comprises raw and structured, semi-structured or unstructured data.

A description of each Key Indicator is provided upstream in step a) of the method, in particular by a super-user. Indeed, the description of the Key Indicator is supposed not to be modified by any regular user. The description of the key indicator comprises the rollup function, i.e. the behavior of the key indicator during the rollup on the expanded directed acyclic graph. The rollup function represents the way the key indicator is bottom-up consolidated in the bill of materials of the virtual configured object OBJ, for one configuration.

The description of the key indicator also includes:
- a name (for example: noise, mass, inertia matrix);
- a magnitude (for example: mass, temperature, pressure);
- potentially, the security in terms of access (is editable by a super-user, or by regular users);
- potentially, its father and children. Indeed, a Key Indicator may contain elements which are Key Indicators themselves;
- potentially, a set of analytics that bring complementary information to the Key Indicator;
- potentially, an icon;

In step b) of the invented method, a set of attributes ATT of the virtual object are received by the index. The attributes ATT are data which are provided by any of the computing systems CSY to the index IND. Therefore, the attributes ATT characterize the object, according to its originating computing system CSY.

Figure 2:
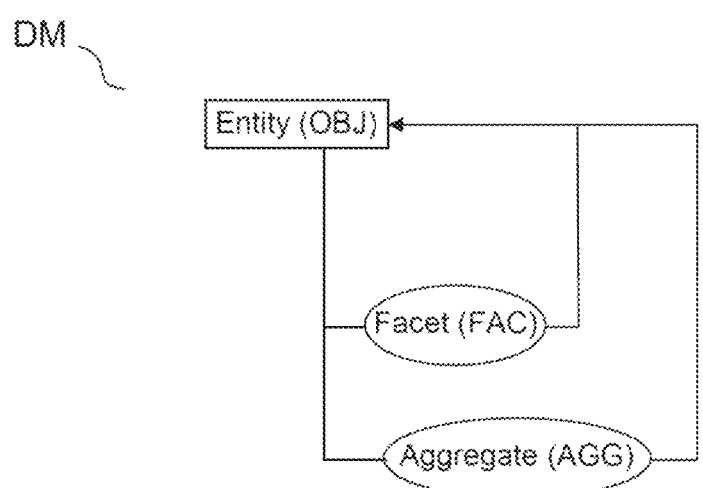
FIG. 2, the data model which is employed in the method according to an embodiment.

A single data model DM is provided in step c) of the method. A data model represents the typing of the objects which are in the index IND, and the typing of the links which structure the objects in the index IND. All the attributes ATT which are transmitted to the index IND are converted according to the data model DM, which is illustrated by FIG. 2.

The conversion consists in:
1. Interpreting the objects OBJ coming from the computer systems CSY, then typing them according to the data model DM, and
2. Creating the links between the objects potentially coming from computer systems CSY. It should be noted that these links do not exist between the computer systems CSY. They exist only in the index IND. Therefore, the index is a software component which creates semi-structured data based on data which are not structured initially.

The data model DM may be qualified as "agnostic" to the extent that any attribute of the object may be converted according to the data model, regardless of the originating computing system CSY or regardless of the format of the attribute ATT.

In the data model DM, two elements characterize the virtual object: at least one aggregate feature AGG, which represents the composition of the virtual object OBJ according to the bill of materials, and/or at least one facet feature FAC representing a categorization of the virtual object OBJ. For example, a mechanical part may have a material facet, a recycling facet, a supplying facet, and so on. More generally, the facet feature specifies the virtual object. The aggregate feature AGG defines the composition of the object according to the bill of materials. An example of composition is the instantiation of the object. By "instantiation", the person skilled in the art refers to its position and orientation in a reference frame affixed to the object. The aggregate feature AGG and the facet feature FAC are referenced in the index IND.

FIG. 3 lists, examples of key indicators information attached to an entity in the data model. For example:
- Key indicator KI1 is directed to the weight, with three facets: the value, the tolerance and the level of confidence;
- Key indicator KI2 is directed to the carbon footprint, with three facets: the value, the tolerance and the level of confidence;
- Key indicator KI3 is directed to the nominal power, with three facets: the value, the tolerance and the level of confidence;
- Key indicator KI4 is directed to the center of gravity, with three facets: the value, the tolerance and the level of confidence.

Whenever an attribute is indexed, the tolerance values may be copied in the data model DM. In an embodiment, a statistical tolerance may be computed based on a Euclidian distance of the tolerance values. If a father and n children are considered, and $\sigma_X$ is the tolerance of the father, and $x_i$ the tolerances of the $i^{th}$ children. The tolerance value of the father is computed using following formula: $\sigma_X = \sqrt{|x_1|^2 + \ldots + |x_n|^2}$. Therefore, when consolidating a key indicator, the user also gets the tolerance value associated to the Key Indicator, so that he can quantify the tolerance computed during the rollup, for example through a margin of error.

Step d) of the invented method comprises receiving a set of rules RUL to convert the attributes of the virtual object OBJ into the data model DM for indexation, and step e) of the invented method comprises applying the set of rules RUL to convert said attributes into the data model DM for indexation.

Figure 4:
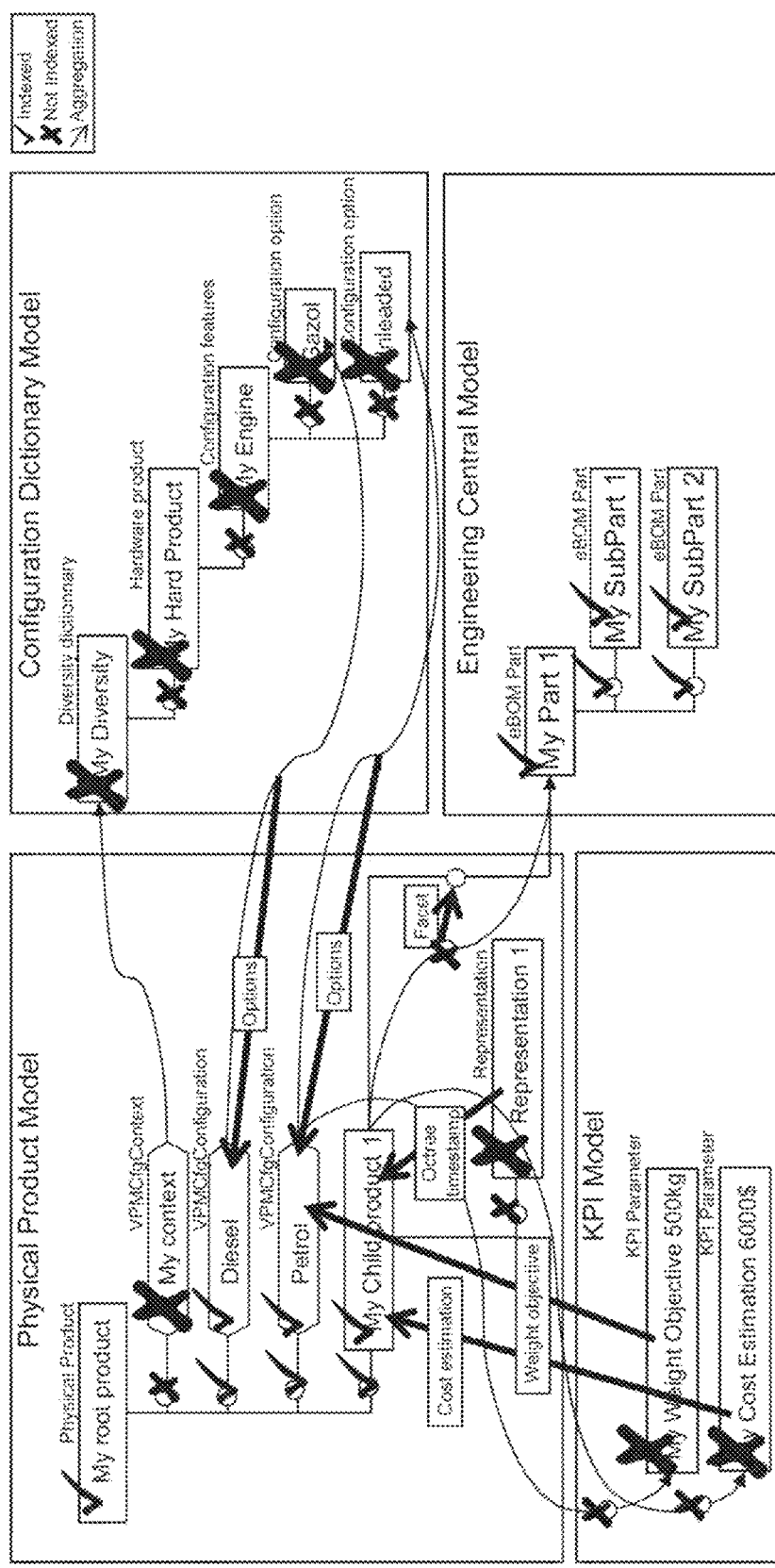
FIG. 4, an example of set of rules that drive the transformation of engineering information into the data model; it also includes the transformation of the diversity information into the data model.

For example, FIG. 4 illustrates the rules which drive the conversion of the engineering information into the data model DM, during the build phase. The "tick" symbol represents the fact that the attribute is indexed. The "cross" symbol represents the fact that the attribute is not indexed. The "arrow" symbol represents the flattening of an attribute: the attribute is copied on the indexed attribute, then it is removed from the index. The decision to index or not an attribute, or to aggregate it, is made by a super user, based on the key indicator which is requested. Therefore, the rules depend on scenarios. An attribute may be aggregated with a facet, so as to categorize it.

For example, there is no need to index the representations of visualization triangles or geometric shapes of an object which is mathematically defined. There is no need to index the Key Indicators as an object, since diversity (configurations) cannot be applied. In the index, the Key Indicators become attributes of objects of the product bill of materials. Objects of the diversity dictionary (also called configuration) do not take part to the bill of materials, so there is no need to index them. On the other hand, the options which are used to define the configurations are indexed. A flattening operation is carried out when there is no diversity possible. The elements which bring nothing to the bill of materials are not indexed.

Figure 5:
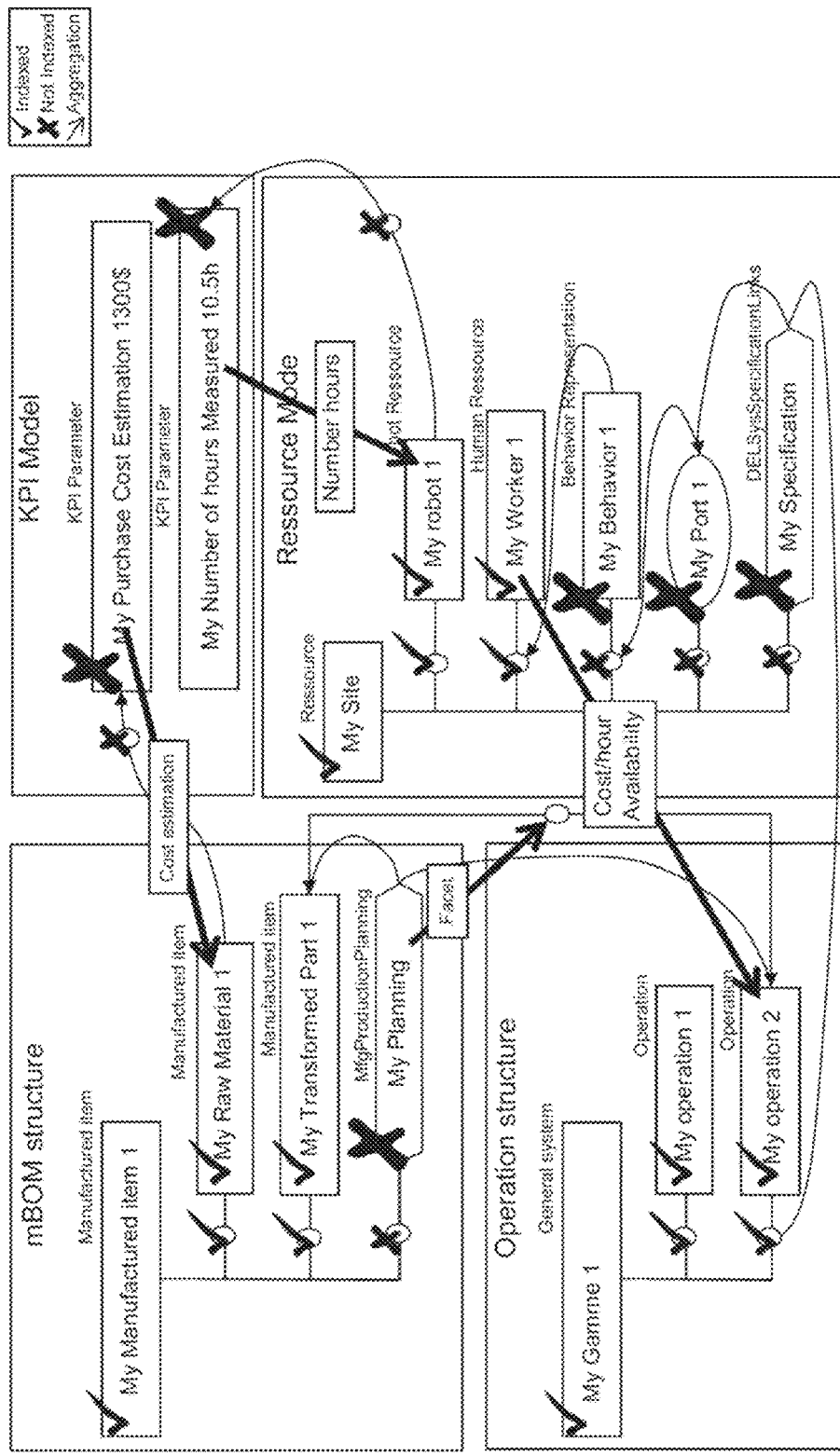
FIG. 5, an example of set of rules that drive the transformation of manufacturing information into the data model; it also includes also the transformation of the diversity information into the data model.

Similarly, FIG. 5 illustrates the rules which drive the conversion of the manufacturing information into the data model, during the build phase.

Figure 6:
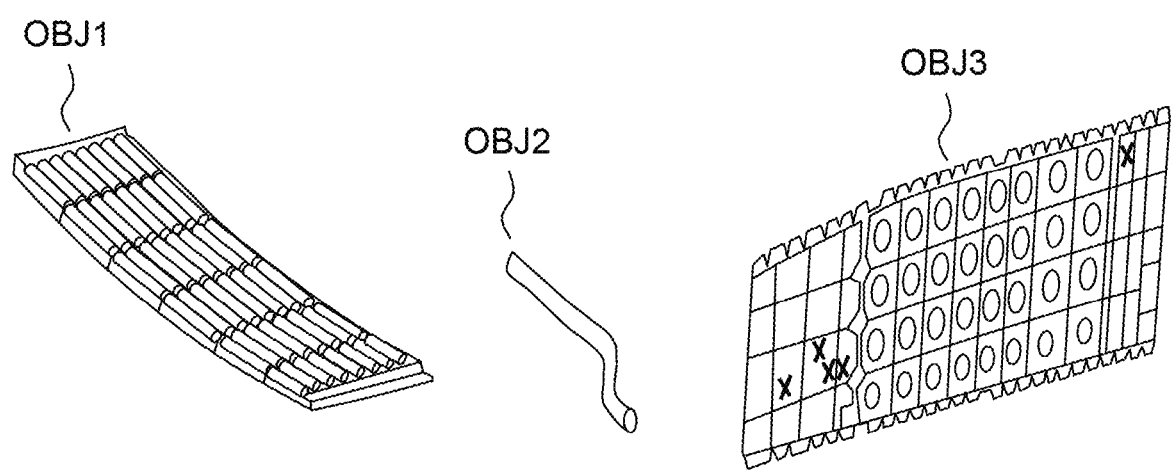
FIG. 6, an example of bill of materials containing three objects.

FIG. 6 illustrates a bill of materials BOM containing three object parts (first object part OBJ1, second object part OBJ2 and third object part OBJ3) of an aircraft. The attributes of the objects are converted for indexation in the index IND, as illustrated by FIG. 7.

Figure 7:
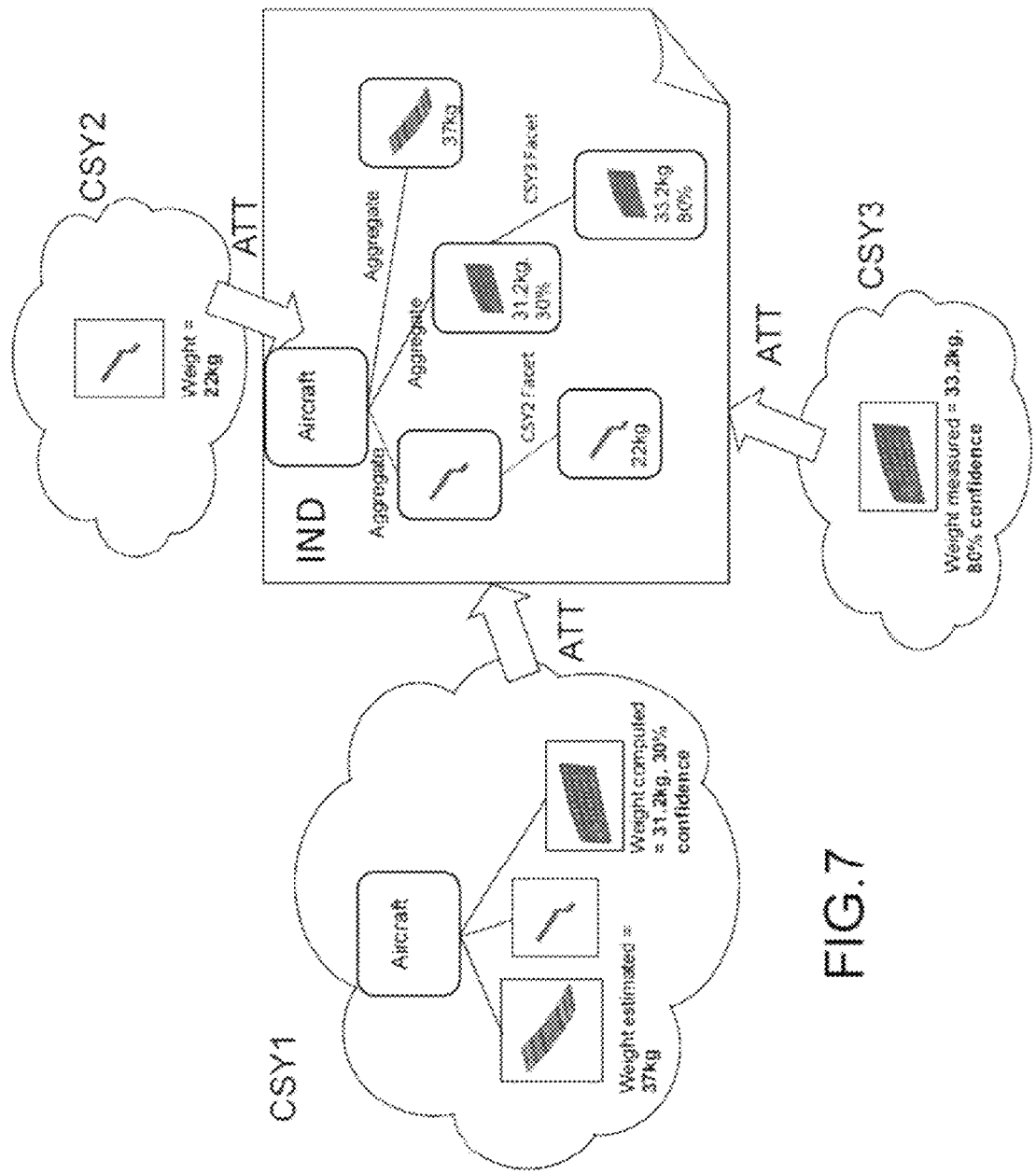
FIG. 7, an illustration of the indexation of the objects illustrated in FIG. 6, according to the data model of an embodiment.

In FIG. 7, a directed acyclic graph, representing an aircraft, is created in the index IND. It aggregates information from a first computing system CSY1 such as a PLM system, from a second computing system CSY2 such as an EIS and from a third computing system CSY3 such as an ERP. The information coming from different silos are structured inside the index IND.

The attributes ATT of the three computing systems (CSY1, CSY2, CSY3) are converted into the data model DM for indexation in the index IND.

In the first computing system CSY1, the root object (the one on which the Key Indicator is to be consolidated, i.e. "aircraft") is stored, with a simplified representation of the 3D geometry of objects OBJ1, OBJ2 and OBJ3, along with:
- an attribute "weight estimated" of the first object OBJ1, with a value of 37 kg;
- an attribute "weight computed" of the third object OBJ3, with a value of 31.2 kg, and a confidence value of 30%.
- and with a simplified representation of the 3D geometry of the three objects OBJ1, OBJ2 and OBJ3.

In the second computing system CSY2, the attribute "weight" of the second object OBJ2 is stored, with a value of 22 kg.

In the third computing system CSY2, the attribute "weight measured" of the third object OBJ3 is stored, with a value of 33.2 kg, and a confidence value of 80%.

The aforementioned attributes ATT are converted into the data model DM for indexation. Then, the root object "aircraft" aggregates:
- a first element C1, which has a CSY2 facet C5;
- a second element C2, which has a CSY3 facet C4;
- a third element C3.

Then, once the attributes ATT are converted according to the data model DM for indexation, the data model is transformed into a directed acyclic graph, as illustrated by FIG. 7, in a tree data structure (step f) of the invented method).

Once the data models have been transformed during the build phase into directed acyclic graphs, the run phase can be carried out on directed acyclic graph. In an embodiment, the aggregate feature AGG and/or the facet feature FAC are incrementally updated in the index IND, and the build phase does not need to be carried out from scratch whenever the data change. Thus, the run phase, which comprises consolidating the key indicator, is based on an expansion of the directed acyclic graph, taking into account a configuration (which is a set of option from the diversity), and with up-to-date data (step g) of the invented method). On each object of the expanded graph, from the bottom to the top, the Key Indicator's specific consolidation method is called.

Figure 8:
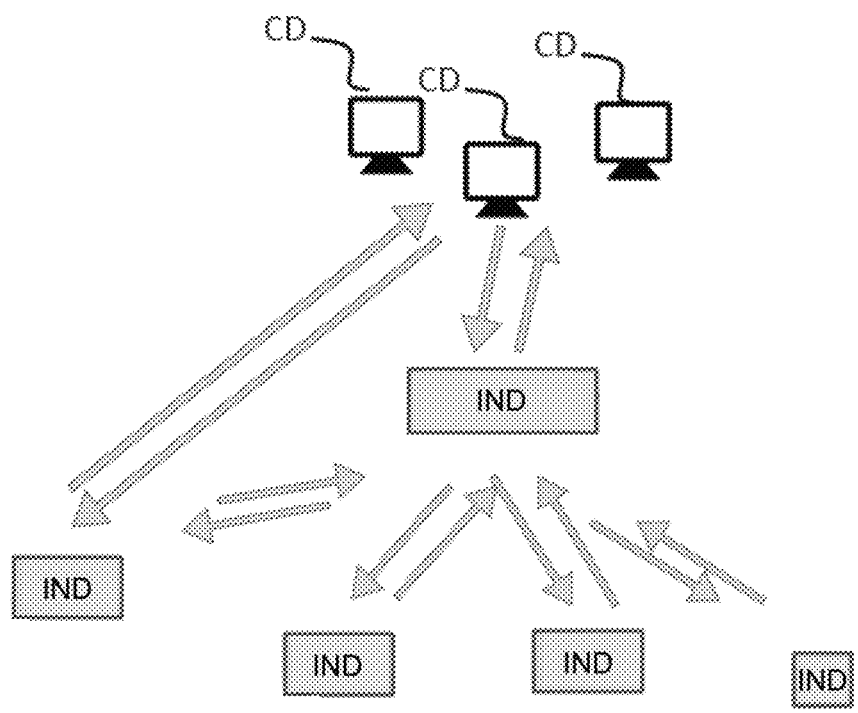
FIG. 8, an illustration of a computer system according to an embodiment.

FIG. 8 is an illustration of a computer system according an embodiment. The system comprises at least one client device CD, configured to process a user request of consolidating the at least one key indicator of a virtual object. For example, the user request may be queried by one of the program managers of the 3D object during the engineering phase, or during the manufacturing phase of the object. The index IND implements at least the steps of transforming the data model DM for indexation into a directed acyclic graph and consolidating said key indicator by expanding the directed acyclic graph.

There may be only one index for the run phase, or several ones. In that case, load balancing may be implemented, in order to optimize some parameters such as the response time of the system, throughput, reliability or the availability of the indexes. Those parameters may be determined by an index controller INC, also called load balancer, connected between the client devices CD and the indexes IND. In particular, regularly, or when receiving a user request from a client device, the index controller INC determines the state of each index IND. If the index controller INC determines that an index IND is unable to process the user request (because of a failure or an unavailability), the index controller INC directs the user requests to another index IND. Once the index controller INC has determined the index which is able to process the user request the most rapidly, the selected index expands the data model DM and consolidates the key indicator which is requested by the user. As illustrated by FIG. 8, a client device CD may communicate with the index controller INC, and also directly with an index IND.

Referring to the example of FIG. 7, the most available index IND, i.e. the one which is considered to have the fastest response time, expands the aircraft tree (the root aircraft itself, and three children, with two second-level children), and rolls up the expanded tree. The expansion of the tree retrieves six elements (C1-C6). The rollup consolidates the weight information from the bottom to the top of the tree. The fifth element C5 is weighted 22 kg. The fourth element C4 is weighted 33.2 kg. The third element C3 is weighted 37 kg. The first element C1 gets directly the same value as the fifth element C5, so the first element C1 weights 22 kg. For the second element C2, the information coming from the two facets are compared. The confidence of 80% is greater than 30%, so the second element C2 is considered to weight 33.2 kg. Finally, the aircraft which aggregates the first element C1, the second element C2 and the third element C3, is considered to weight the 22+33.2+37=92.2 kg.

In an embodiment, the step of transforming initial data to the index data model (in the build phase) and the step of consolidating the key indicator (in the run phase) are implemented in a same software component, in particular in the index IND, with a shared memory. Therefore, the drawbacks of using two distinct software components (one for the indexation, and one for the consolidation), due to the data transfer between the components, and to the duplication of the directed acyclic graphs between both software components, are avoided. The invented method is highly scalable, with a high level of availability.

Steps a) to f) (the build phase) of the invented method may be implemented offline, and step g) (the run phase) may be implemented online. The offline implementation of the build phase saves a lot of computing time.

Figure 9:
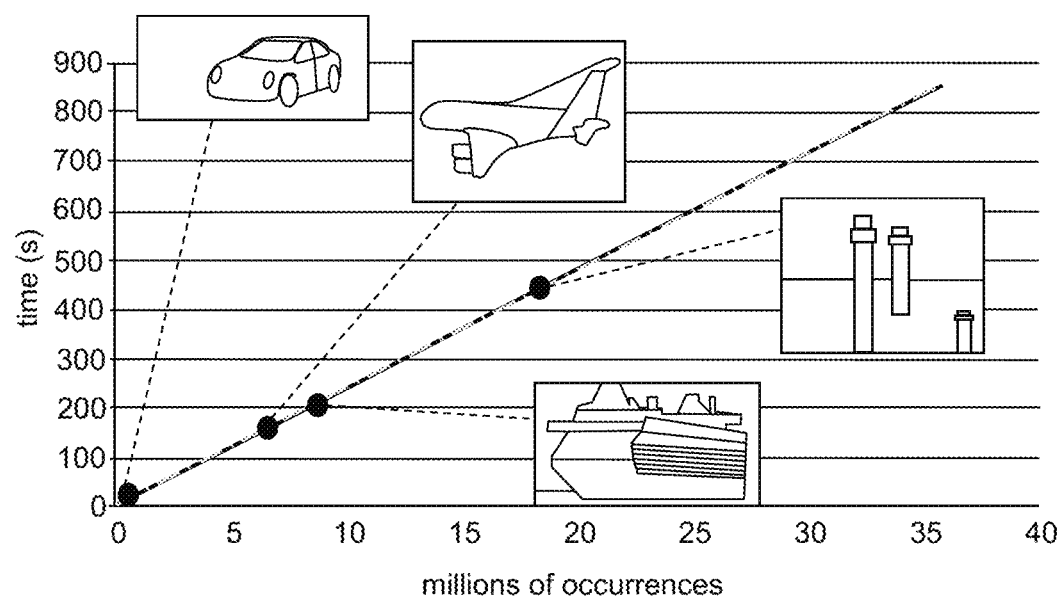
FIG. 9, a graphic representation illustrating the scalability of the method, measured on one implementation of an embodiment.

FIG. 9 illustrates the scalability measured on an implementation of the invented method. In this implementation, an Apache TomEE server has been used as an index controller, and an Exalead Graph Index (property of Dassault Systèmes) has been used as an index. The data are provided by three computer systems: a PLM called 3DSpace (property of Dassault Systèmes), an ERP called SAP, from which spreadsheet data are extracted (for example data from Excel files), and a computer which has received an email from a subcontractor, containing a spreadsheet such as an Excel file.

The client device on which the user request have been made is a standard computer, available on the market for any user (WINDOWS server, 64-bit operating system, Intel Xeon CPU ES-1620 v3 3.50 GHz, 16.0 GB RAM)

The Key Indicators of weight and balance and cost calculation of a product have been consolidated.

The horizontal axis represents the number of object parts (i.e. the number of elements) of a virtual object. The vertical axis represents the response time of a user request of the weight and balance KPIs.

The response time is far below the described above state of the art solutions: for a cruise ship, with 8 million elements, the response time is 200 seconds. For a petrochemical plant, with 18 million elements, the response time is 450 seconds. Moreover, the response time is linear: one can predict the response time based on the number of elements.

Figure 10:
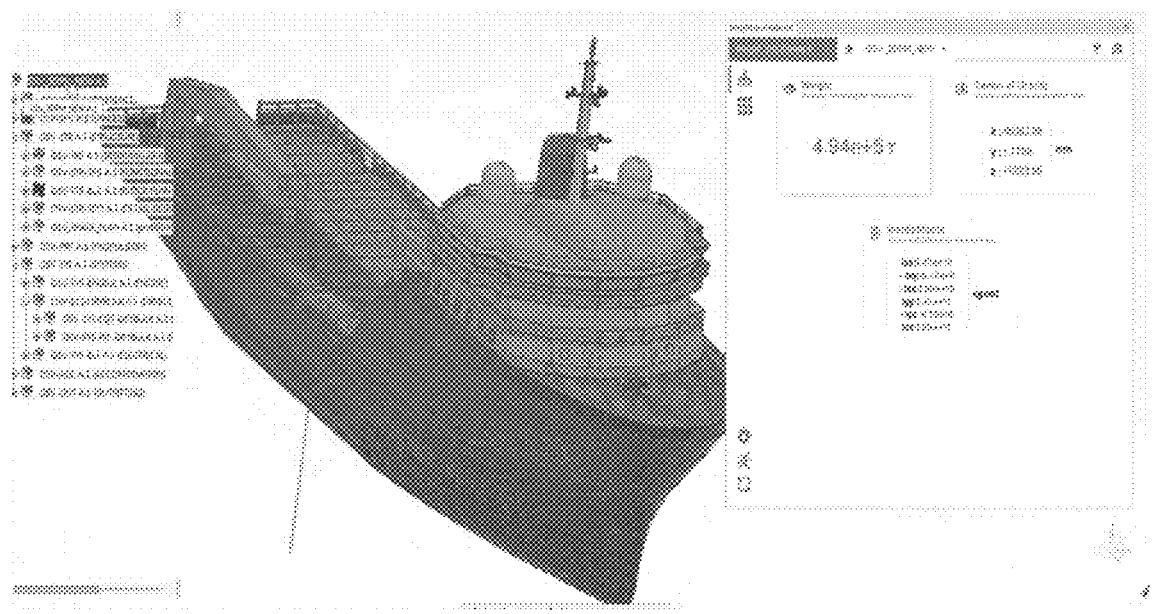
FIG. 10, an example of display of the weight and balance rollup result on a ship.

FIG. 10 illustrates a screenshot representing the result of the weight and balance KPIs of a cruise ship, with the invented method. On the left part of screen, the user can select the whole object, or sub-parts of it by browsing through in the tree of the object. The selection of the user may be highlighted on the central part of the screen. On the right part of the screen, the result of the consolidation is displayed, in particular the weight, the center of gravity and the inertia matrix.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 11:
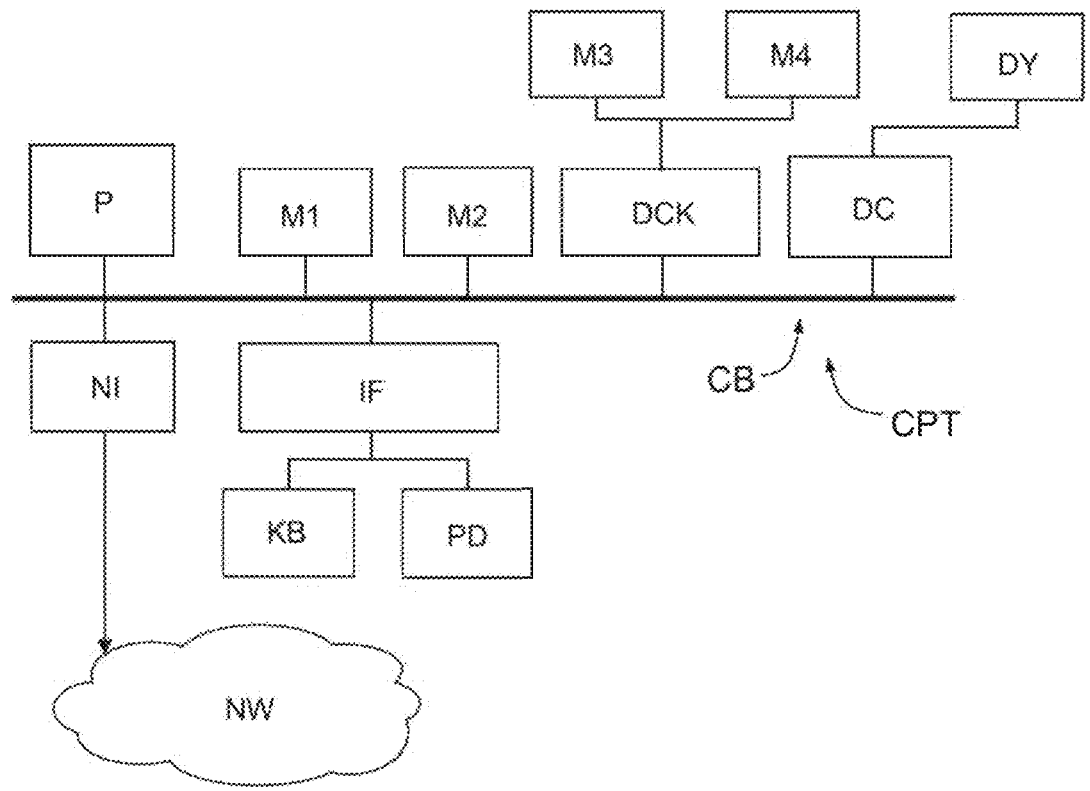
FIG. 11, a computer suitable for carrying out a method according to an exemplary embodiment.

Each of the aforementioned client devices CD, computing systems CSY, index IND and index controller INC can be a computer CPT suitable for carrying out a method according to an exemplary embodiment is described with reference to FIG. 11. In FIG. 11, the computer CPT includes a Central Processing Unit (CPU) P which performs the method step described above while running an executable program, i.e. a set of computer-readable instructions, stored in a memory device such as RAM M1 or ROM M2 or hard disk drive (HDD) M3, DVD/CD drive M4, or stored remotely.

The claimed invention is not limited by the form of the computer-readable media on which the computer-readable instructions and/or the data structure of the inventive process are stored. For example, the instructions and files can be stored on CDs, DVDs, in FLASH memory, RAM, ROM, PROM, EPROM, EEPROM, hard disk or any other information processing device with which the computer communicates, such as a server or computer. The program and the files can be stored on a same memory device or on different memory devices.

Further, a computer program suitable for carrying out the inventive method can be provided as a utility application, background daemon, or component of an operating system, or combination thereof, executing in conjunction with CPU P and an operating system such as Microsoft VISTA, Microsoft Windows 10, UNIX, Solaris, LINUX, Apple MAC-OS and other systems known to those skilled in the art.

CPU P can be a Xenon processor from Intel of America or an Opteron processor from AMD of America, or can be other processor types, such as a Freescale ColdFire, IMX, or ARM processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer CPT in FIG. 11 also includes a network interface NI, such as an Intel Ethernet PRO network interface card from Intel Corporation of America, for interfacing with a network, such as a local area network (LAN), wide area network (WAN), the Internet and the like. The computer further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, form a graphical user interface, used by the user to provide input commands and by the computer for displaying the result of the Key Indicator, as illustrated on FIG. 10.

Disk controller DKC connects HDD M3 and DVD/CD M4 with communication bus CBS, which can be an ISA, EISA, VESA, PCI, or similar, for interconnecting all of the components of the computer.

A description of the general features and functionality of the display, keyboard, pointing device, as well as the display controller, disk controller, network interface and I/O interface is omitted herein for brevity as these features are known.

In an alternative embodiment, computer CPT is replaced by a server and an end user computer. The overall architecture of the server may be the same as discussed above with reference to computer CPT, except that display controller, display, keyboard and/or pointing device may be missing in the server. The end user computer runs the front-end section of the "run" infrastructure, including the user interface; the server runs the "build" infrastructure and the back-end section of the "run" infrastructure. An action of the user on the user interface launches a query—e.g. a REST query—to a webservice provided by the server (e.g. an Apache server) which executes the Key Indicator rollup algorithm.

Network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

Any method steps described herein should be understood as representing modules, segments, or portions of code which include one or more executable instructions for implementing specific logical functions or steps in the process, and alternate implementations are included within the scope of the exemplary embodiment.

The invention claimed is:

1. A computer implemented method for consolidating at least one key indicator of a virtual object, the method comprising:
selecting a virtual object upon a user input;
for a predefined configuration of the virtual object,
receiving a description of at least one key indicator of the virtual object;
receiving a set of attributes of the virtual object, said set of attributes characterizing the virtual object, according to an originating computing system of the virtual object, said originating computing system being connected to a search engine index;
receiving a data model for indexation of said virtual object, said data model representing a typing of the virtual object in the search engine index;
receiving a set of rules to convert the set of attributes of the virtual object into the data model for indexation;
receiving first information generated from a computing system including at least one of a Product Lifecycle Management system, an Enterprise Resource Planning system, and an Enterprise Information System;
receiving second information generated from a plurality of sensors;
applying, by the computer, the set of rules to convert said set of attributes into the data model for indexation, the conversion using the first and second information;
transforming, by the computer, the data model for indexation into a directed acyclic graph, the transforming including creating the directed acyclic graph by aggregating the first information generated from the computing system, and the second information generated from the plurality of sensors; and
consolidating, by the computer, said at least one key indicator based on an expansion of the directed acyclic graph, a result of the consolidation being a computer file,
wherein, in the data model, the virtual object includes:
at least one aggregate feature, said aggregate feature representing a position and an orientation of the virtual object in a reference frame affixed to the object, and/or
at least one facet feature, said facet feature representing a categorization of the virtual object,
wherein said aggregate feature and/or said facet feature being referenced in the search engine index,
wherein transforming the data model and consolidating said at least one key indicator are implemented, by the computer, in a same software component of said search engine index,
wherein the method further comprises making the computer file available for manufacturing the virtual object.

2. The computer implemented method according to claim 1, wherein the at least one aggregate feature and/or the at least one facet feature re incrementally updated in the index.

3. The method according to claim 1, wherein the consolidating further comprises applying a rollup on an expanded directed acyclic graph in the index.

4. The method according to claim 3, wherein the receiving the description of at least one key indicator further comprises receiving a rollup function of the key indicator during the rollup on the expanded directed acyclic graph, said rollup function representing a way the key indicator is bottom-up consolidated in a bill of materials of the virtual object.

5. The method according to claim 1, wherein the consolidating further comprises receiving a tolerance value of each aggregate feature, and computing a statistical tolerance based on a Euclidian distance of said tolerance value.

6. The method according to claim 1, wherein the key indicator is a Key Performance Indicator of the virtual object.

7. The method according to claim 6, wherein the Key Performance Indicator includes a weight and balance of the virtual object and/or a center of gravity of the virtual object and/or an inertia matrix of the virtual object.

8. The method according to claim 1, wherein the virtual object is a vehicle including a ship.

9. A non-transitory computer-readable data-storage medium containing computer-executable instructions that when executed by a computer system cause the computer system to implement a method for consolidating at least one key indicator of a virtual object, the method comprising:
selecting a virtual object upon a user input;
for a predefined configuration of the virtual object,
receiving a description of at least one key indicator of the virtual object;
receiving a set of attributes of the virtual object, said set of attributes characterizing the virtual object, according to an originating computing system of the virtual object, said originating computing system being connected to a search engine index;
receiving a data model for indexation of said virtual object, said data model representing a typing of the virtual object in the search engine index;
receiving a set of rules to convert the set of attributes of the virtual object into the data model for indexation;
receiving first information generated from a computing system including at least one of a Product Lifecycle Management system, an Enterprise Resource Planning system, and an Enterprise Information System;
receiving second information generated from a plurality of sensors;
applying the set of rules to convert said set of attributes into the data model for indexation, the conversion using the first and second information;
transforming the data model for indexation into a directed acyclic graph, the transforming including creating the directed acyclic graph by aggregating the first information generated from the computing system and the second information generated from the plurality of sensors; and
consolidating said at least one key indicator based on an expansion of the directed acyclic graph, a result of the consolidation being a computer file,
wherein, in the data model, the virtual object includes:
at least one aggregate feature, said aggregate feature representing a position and an orientation of the virtual object in a reference frame affixed to the object, and/or
at least one facet feature, said facet feature representing a categorization of the virtual object,
wherein said aggregate feature and/or said facet feature being referenced in the search engine index, and
wherein transforming the data model and consolidating said at least one key indicator are implemented in a same software component of said search engine index, wherein the method further comprises making the computer file available for manufacturing the virtual object.

10. A computer system, comprising:
at least one client device including a processor configured to
select a virtual object upon a user input;
process a user request of consolidating at least one key indicator of a virtual object and at least one index, said index being configured to implement transformation of a data model for indexation into a directed acyclic graph and consolidation of said at least one key indicator based on an expansion of the directed acyclic graph,
wherein the processor is further configured to, for a predefined configuration of the virtual object:
receive a description of the at least one key indicator of the virtual object,
receive a set of attributes of the virtual object, said set of attributes characterizing the virtual object, according to an originating computing system of the virtual object, said originating computing system being connected to a search engine index,
receive the data model for indexation of said virtual object, said data model representing a typing of the virtual object in the search engine index,
receive a set of rules to convert the set of attributes of the virtual object into the data model for indexation,
receive first information generated from a computing system including at least one of a Product Lifecycle Management system, an Enterprise Resource Planning system, and an Enterprise Information System,
receive second information generated from a plurality of sensors,
apply, by the computer, the set of rules to convert said set of attributes into the data model for indexation, the conversion using the first and second information,
transform, by the computer, the data model for indexation into a directed acyclic graph, the transforming including creating the directed acyclic graph by aggregating the first information generated from the computing system and the second information generated from the plurality of sensors, and
consolidate, by the computer, said at least one key indicator based on an expansion of the directed acyclic graph, a result of the consolidation being a computer file, wherein, in the data model, the virtual object includes:
at least one aggregate feature, said aggregate feature representing a position and an orientation of the virtual object in a reference frame affixed to the object, and/or
at least one facet feature, said facet feature representing a categorization of the virtual object,
wherein said aggregate feature and/or said facet feature being referenced in the search engine index,
wherein transforming the data model and consolidating said at least one key indicator are implemented, by the computer, in a same software component of said search engine index,
wherein the processor is further configured to make the computer file available for manufacturing the virtual object.

11. The computer system according to claim 10, further comprising:
a plurality of indexes,
wherein said processor is further configured to determine, among said plurality of indexes, an index which is able to process the user request most rapidly, and
wherein the processor is further configured to transforming the data model for indexation into a directed acyclic graph and consolidate said key indicator based on an expansion of the configured directed acyclic graph being implemented in said index.

12. The method according to claim 1, wherein, in the data model, the virtual object includes:
at least one aggregate feature, said aggregate feature representing the composition of the virtual object according to a bill of materials, and
at least one facet feature, said facet feature representing a categorization of the virtual object,
wherein said aggregate feature and said facet feature being referenced in a search engine index, and
wherein transforming the data model and consolidating said at least one key indicator are implemented in a same software component of said search engine index.

13. The method of claim 1, wherein the key performance indicator includes a weight and balance of the virtual object and/or a center of gravity of the virtual object and/or an inertia matrix of the virtual object.

* * * * *